United States Patent
Fujimoto

(10) Patent No.: US 7,095,673 B2
(45) Date of Patent: Aug. 22, 2006

(54) SEMICONDUCTOR MEMORY DEVICE CAPABLE OF OPERATING AT HIGH SPEED

(75) Inventor: Yukihiro Fujimoto, Yokohama (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 11/087,600

(22) Filed: Mar. 24, 2005

(65) Prior Publication Data

US 2006/0109732 A1 May 25, 2006

(30) Foreign Application Priority Data

Nov. 22, 2004 (JP) ............................ 2004-337679

(51) Int. Cl.
*G11C 8/14* (2006.01)
(52) U.S. Cl. .................. 365/230.03; 365/63; 365/233
(58) Field of Classification Search ................ None
See application file for complete search history.

(56) References Cited

U.S. PATENT DOCUMENTS 5,386,394 A * 1/1995 Kawahara et al. .......... 365/208

6,517,887 B1 * 2/2003 Lilieblad ................ 427/2.14
6,704,828 B1 * 3/2004 Merritt et al. ............. 710/305

FOREIGN PATENT DOCUMENTS

JP 10-308089 11/1998
JP 2002-100187 4/2002

OTHER PUBLICATIONS

Steven K. Hsu, et al. "A 4.5 GHz 130nm 32KB L0 Cache with a Self Reserve Bias Scheme", 2002 Symposium on VLSI Circuits Digest of Technical Papers, pp. 48-49.

* cited by examiner

Primary Examiner—Tan T. Nguyen
(74) Attorney, Agent, or Firm—Oblon, Spivak, McClelland, Maier & Neustadt, P.C.

(57) ABSTRACT

A plurality of sub-arrays include a plurality of memory elements. First bit line pairs are connected to a plurality of memory elements provided in each of the sub-arrays. Second bit line pairs are provided so as to correspond to a plurality of sub-arrays. The first bit line pairs supply signals to the second bit line pairs. The second bit line pairs are operated at a lower frequency than the first bit line pairs.

18 Claims, 4 Drawing Sheets

SEMICONDUCTOR MEMORY DEVICE CAPABLE OF OPERATING AT HIGH SPEED

CROSS-REFERENCE TO RELATED APPLICATIONS

This application is based upon and claims the benefit of priority from prior Japanese Patent Application No. 2004-337679, filed Nov. 22, 2004, the entire contents of which are incorporated herein by reference.

BACKGROUND OF THE INVENTION

1. Field of the Invention

This invention relates to, for example, a static random access memory (hereinafter, referred to as SRAM), and more particularly to an on-chip semiconductor memory device used in a microprocessor or the like.

2. Description of the Related Art

In recent years, to meet a demand for system performance enhancement, system LSIs, such as microprocessors, have been speeded up. In parallel with this, the SRAM embedded in the system SLI has also been required to operate at high operating frequency.

The cell array of an SRAM has been divided into sub-arrays. The bit lines are composed of the local bit lines in each sub-array and the global bit lines shared by the sub-arrays. Hierarchizing the bit lines this way makes it possible to reduce the load on the bit lines required to charge and discharge in one cycle of the clock signal, which enables a high-speed operation.

As an SRAM of this type, the technique for preventing an increase in the number of bit lines per cell has been developed (for example, refer to Jpn. Pat. Appln. KOKAI Publication No. 2002-100187). Moreover, to reduce the chip area, a semiconductor memory device which has a hierarchic bit line structure with a decreased number of global bit lines has been developed (for example, refer to Jpn. Pat. Appln. KOKAI Publication No. 10-308089).

However, when the bit lines are hierarchized, the operating frequency of the SRAM is determined by the operating frequency of a global bit line with a high load, not by the operating frequency of the memory access in the sub-array. For this reason, it is difficult to increase the operating frequency remarkably.

Furthermore, another type of SRAM has been developed. The SRAM, which does not use a hierarchic bit line structure, causes transfer gates connected between a pair of nodes and a pair of bit lines which memorize complementary data in a memory cell to operate in different phases of the clock signal. The SRAM operates as follows. In the first half of one cycle of the clock signal, the word line for the transfer gate connected to one bit line is activated, with the result that the data read from the selected cell is supplied to the one bit line. Then, in the latter half of the one cycle of the clock signal, the word line for the transfer gate connected to the other bit line is activated, with the result that the data read from the selected cell is supplied to the other bit line. The data read onto the respective bit lines are selected and output alternately according to the phase of the clock signal. In this example, the throughput of read-out data from the SRAM can be doubled by changing the phase of the clock signal used to access a pair of complementary bit lines. Therefore, the SRAM operates as if the operating frequency were doubled. However, since a pair of transfer gates is selected alternately, each memory cell has to be provided with two word lines. Accordingly, in the SRAM, the area occupied by the memory cells becomes large, which causes the problem of increasing the area of the entire SRAM. Therefore, there has been a need for a semiconductor memory device capable of a high-speed operation at a high operating frequency, while suppressing an increase in the cell area.

BRIEF SUMMARY OF THE INVENTION

According to a first aspect of the invention, there is provided a semiconductor memory device comprising: a plurality of sub-arrays each of which includes a plurality of memory elements; first bit line pairs which are provided in each of the plurality of sub-arrays and which are connected to the plurality of memory elements; and second bit line pairs which are provided so as to correspond to the plurality of sub-arrays and to which the first bit line pairs supply signals and which are operated at a lower frequency than the first bit line pairs.

According to a second aspect of the invention, there is provided a semiconductor memory device comprising: a plurality of sub-arrays each of which includes a plurality of memory elements; first bit line pairs which are arranged in a first column in each of the plurality of sub-arrays and which are connected to the plurality of memory elements; second bit line pairs which are arranged in a second column in each of the plurality of sub-arrays and which are connected to the plurality of memory elements; a first selector which selects either one of the first bit line pair or one of the second bit line pair; a second selector which selects either the other of the first bit line pair or the other of the second bit line pair; and third bit line pairs which are provided so as to correspond to the plurality of sub-arrays and to which the first and second selectors selectively supply signals and which are operated at a lower frequency than the first and second bit line pairs.

DETAILED DESCRIPTION OF THE INVENTION

Hereinafter, referring to the accompanying drawings, an embodiment of the present invention will be explained.

Figure 1:
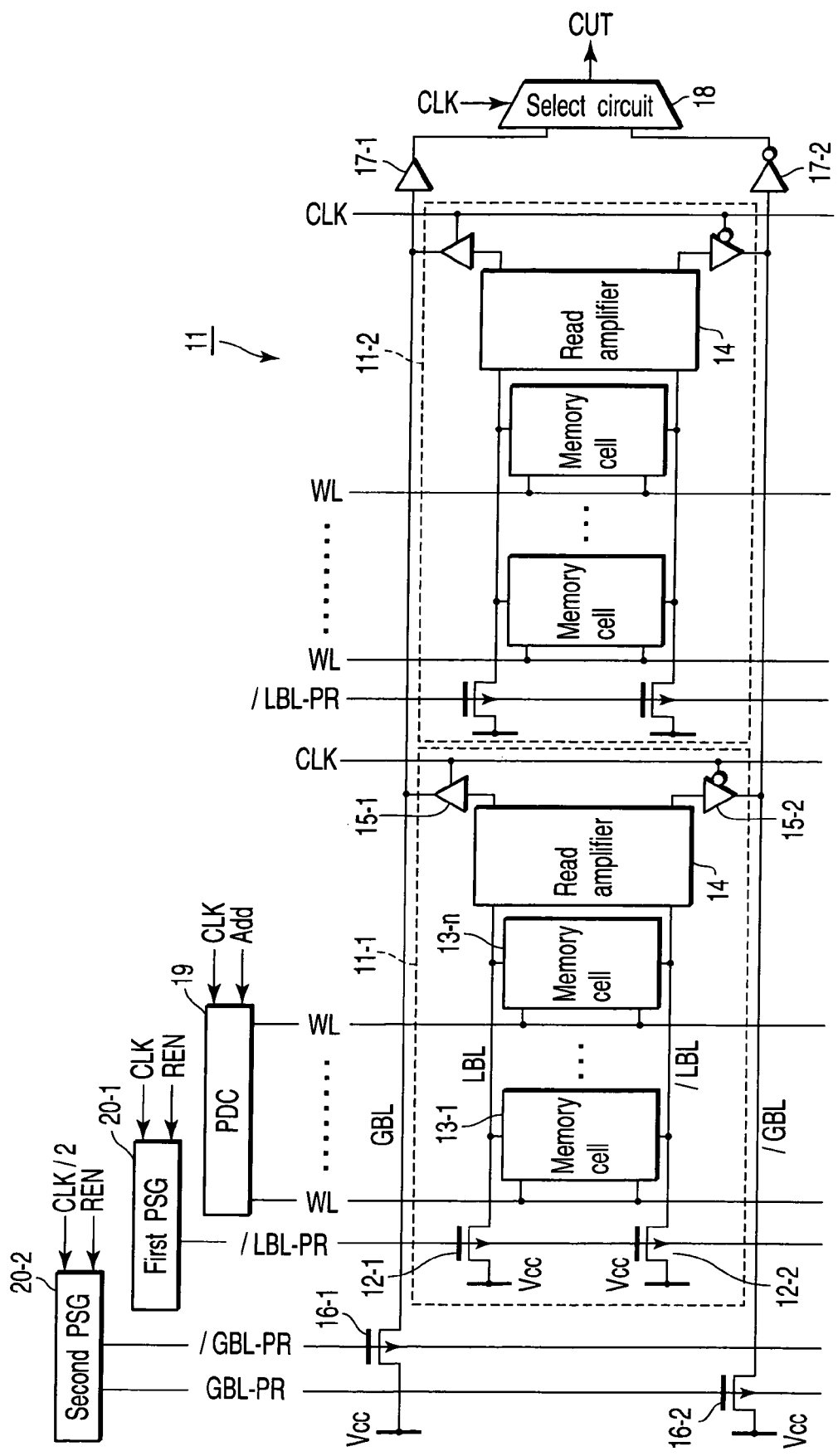
FIG. 1 is a circuit diagram of an SRAM according to an embodiment of the present invention.

FIG. 1 shows an SRAM according to the embodiment. In FIG. 1, a cell array 11, which has a plurality of memory cells, is divided into a plurality of sub-arrays 11-1, 11-2 arranged in the column direction. Although FIG. 1 shows only two sub-arrays arranged in the column direction, these sub-arrays are also arranged in the row direction. Since the sub-arrays 11-1, 11-2 have the same configuration, only the sub-array 11-1 will be explained hereinafter.

The sub-array 11-1 includes a pair of local bit lines LBL, /LBL, p-channel MOS transistors 12-1, 12-2, memory cells 13-1 to 13-n, a read amplifier 14, and try-state buffers 15-1, 15-2.

The p-channel MOS transistors 12-1, 12-2 constitute a local bit line precharge circuit. The p-channel MOS transistor 12-1 is connected between a node to which a power supply Vcc is supplied and one end of local bit line LBL. The p-channel MOS transistor 12-2 is connected between a node to which the power supply Vcc is supplied and one end of local bit line /LBL. A precharge signal /LBL-PR is supplied to the gates of these p-channel MOS transistors 12-1, 12-2. The memory cells 13-1 to 13-n are connected to local bit lines LBL, /LBL. In addition, the memory cells 13-1 to 13-n are connected to the corresponding word lines WL.

The read amplifier 14, which is connected to local bit lines LBL, /LBL, amplifies the data on local bit lines LBL, /LBL. The try-state buffer 15-1 is connected between the output terminal corresponding to the local bit line LBL of the read amplifier 14 (or the other end of local bit line LBL) and global bit line GBL. The try-state buffer 15-2 is connected between the output terminal corresponding to the local bit line /LBL of the read amplifier 14 (or the other end of local bit line /LBL) and global bit line /GBL. A clock signal CLK for a system LSI is supplied to the control signal input terminal of the try-state buffer 15-1. The inverted signal of the clock signal CLK is supplied to the control signal input terminal of the try-state buffer 15-2. Therefore, the try-state buffers 15-1, 15-2 operate complementarily according to the clock signal.

Furthermore, for example, a p-channel MOS transistor 16-1 constituting a global bit line precharge circuit is connected between a node to which the power supply Vcc is supplied and one end of global bit line GBL. A p-channel MOS transistor 16-2 is connected between a node to which the power supply Vcc is supplied and one end of global bit line /GBL. A precharge signal /GBL-PR is supplied to the gate of the transistor 16-1. A precharge signal GBL-PR is supplied to the gate of the transistor 16-2.

The other end of global bit line GBL is connected via a buffer circuit 17-1 to one input terminal of a select circuit 18. The other end of global bit line /GBL is connected via an inverter circuit 17-2 to the other input terminal of the select circuit 18. The clock signal CLK is supplied to the select circuit 18. According to the clock signal CLK, the select circuit 18 outputs one of the signals on global bit liens GBL, /GBL.

The word lines WL are connected to a row decoder (RDC) 19. the row decoder 19 selects a word line WL according to the clock signal CLK of the system LSI and an address signal Add. A first precharge signal generator (first PSG) 20-1 generates the precharge signal /LBL-PR in synchronization with the clock signal and a read enable signal REN. In addition, a second precharge signal generator (second PSG) 20-2 generates the precharge signals GBL-PR, /GBL-PR in synchronization with, for example, a signal whose frequency is half that of the clock signal CLK and the read enable signal REN.

Figure 2:
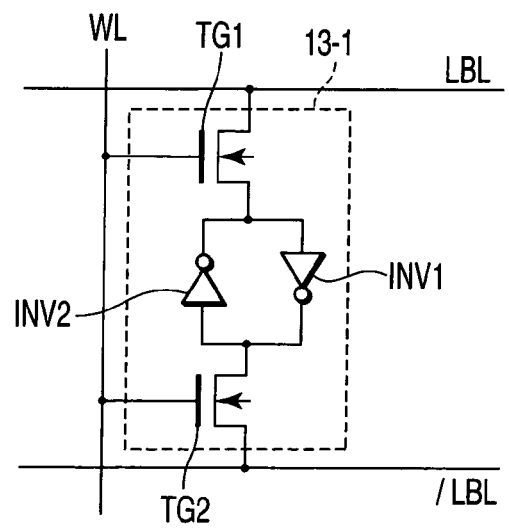
FIG. 2 is a circuit diagram of an example of a memory cell in FIG. 1.

FIG. 2 shows an example of the memory cells 13-1 to 13-n. In FIG. 2, the memory cell 13-1 is composed of inverter circuits INV1, INV2 and transfer gates TG1, TG2 which constitute a flip-flop circuit. The transfer gate TG1 is connected between the inverter circuits INV1, INV2 and the local bit line LBL. The transfer gate TG2 is connected between the inverter circuits INV1, INV2 and the local bit line /LBL. The gates of these transfer gates TG1, TG2 are connected to a word line WL.

Figure 3:
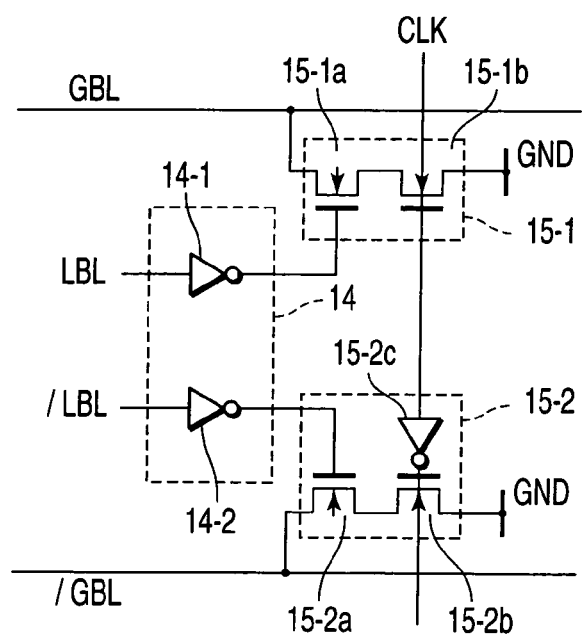
FIG. 3 is a circuit diagram of an example of the read amplifier and try-state buffer in FIG. 1.

FIG. 3 shows an example of the read amplifier 14 and try-state buffers 15-1, 15-2. The read amplifier 14 is composed of, for example, inverter circuits 14-1, 14-2. An input terminal of the inverter circuit 14-1 is connected to local bit line LBL and an input terminal of the inverter circuit 14-2 is connected to local bit line /LBL. These invert circuits 14-1, 14-2 amplify the potentials on local bit lines LBL, /LBL.

The try-state buffer 15-1 is composed of n-channel MOS transistors 15-1a, 15-1b. The gate of the n-channel MOS transistor 15-1a is connected to an output terminal of the inverter circuit 14-1 (local bit line LBL). One end of the current path of the transistor 15-1a is connected to global bit line GBL and the other end of the current path is connected via the transistor 15-1b to a node to which the ground potential GND is supplied. The clock signal CLK is supplied to the gate of the transistor 15-1b. The try-state buffer 15-2 is composed of n-channel MOS transistors 15-2a, 15-2b and an inverter circuit 15-2c. The gate of the transistor 15-2a is connected to an output terminal of the inverter circuit 14-2 (local bit line /LBL). One end of the current path of the transistor 15-2a is connected to global bit line /GBL and the other end of the current path is connected via the transistor 15-2b to a node to which the ground potential GND is supplied. The inverted clock signal CLK is supplied via the inverted circuit 15-2 to the gate of the transistor 15-2b.

Figure 4:
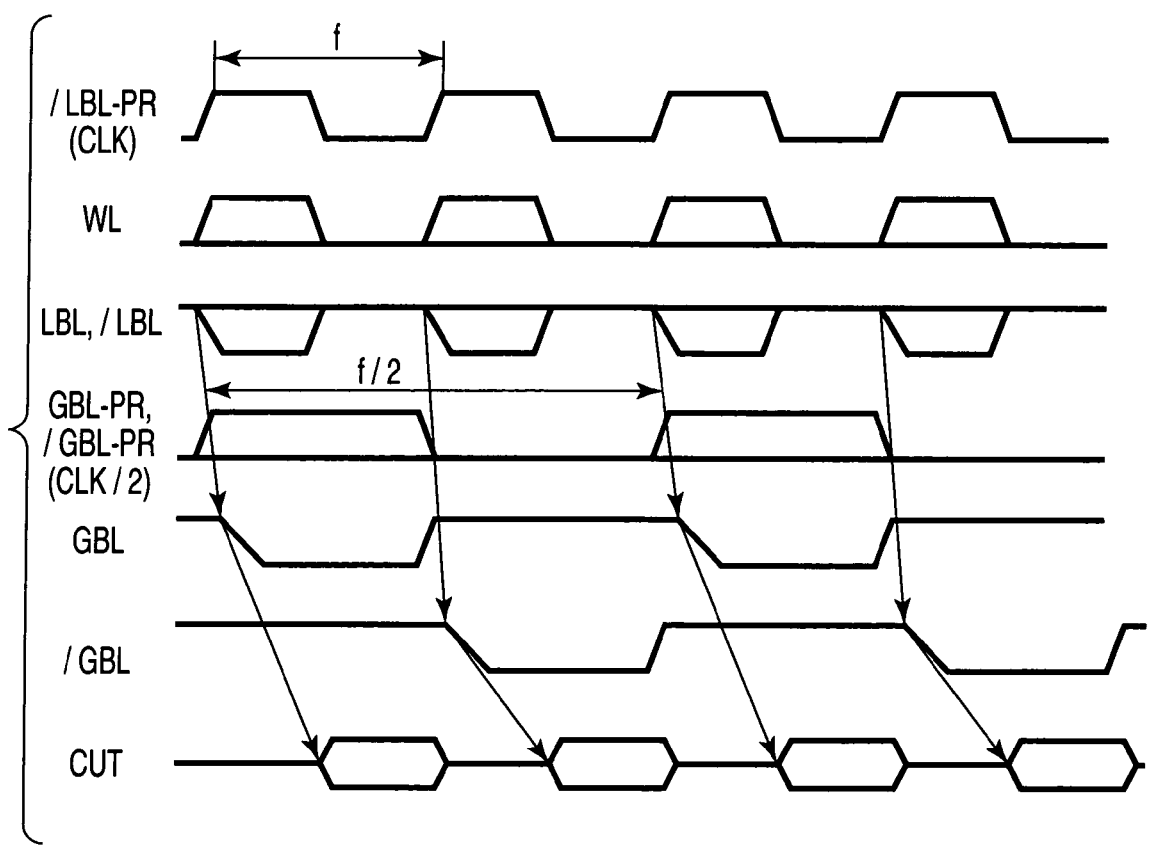
FIG. 4 is a timing chart for an operation in FIG. 1.

FIG. 4 shows operating waveforms of the SRAM of FIG. 1. Referring to FIG. 4, the operation of the SRAM will be explained. The memory cells in the sub-arrays 11-1, 11-2, local bit lines LBL, /LBL, and transistors 12-1, 12-2, and read amplifier 14 operate at the rising edge and falling edge of the clock signal CLK. Specifically, the precharge signal /LBL-PR for local bit lines LBL, /LBL drives the transistors 12-1, 12-2 according to the high-speed clock signal CLK of the system LSI, thereby precharging local bit lines LBL, /LBL. The row decoder 19 selects a word line according to the precharging of local bit lines LBL, /LBL in synchronization with the clock signal CLK. The data read from the selected memory cell is output onto local bit lines LBL, /LBL. The data on the local bit lines LBL, /LBL is amplified by the read amplifier 14.

On the other hand, global bit line GBL operates at a frequency half that of the clock signal CLK. Specifically, during one cycle of the clock signal CLK, the precharge signal /GBL-PR goes high, which turns off the transistor 16-1. As a result, the precharging of global bit line GBL is stopped. At this time, global bit line GBL transmits the data supplied from the read amplifier 14 via the try-state buffer 15-1. In addition, on global bit line /GBL, the precharge signal GBL-PR goes high in the next cycle of the clock signal CLK, which turns off the transistor 16-2. As a result, the precharging of global bit line /GBL is stopped. At this time, global bit line /GBL transmits the data supplied from the read amplifier 14 via the try-state buffer 15-2. The select circuit 18 selects one of the global bit lines GBL, /GBL according to the phase of the clock signal CLK and outputs the read-out data. Therefore, the select circuit 18 outputs the data at intervals of one cycle of the clock signal.

In the embodiment, the precharging of the local bit lines LBL, /LBL, the selection of the word lines, the operating frequency of the read amplifier, and the select circuit 18 in the sub-array are made compatible with the clock signal CLK of the system LSI. The global bit lines GBL, /GBL whose load is heavier than that on the local bit lines LBL, /LBL are operated alternately at a frequency half that of the local bit lines LBL, /LBL. Therefore, the operating frequency of the SRAM is determined by the operating frequency of the sub-array, not by the operating frequency of the global bit lines whose load is heavy. Consequently, the operating frequency can be improved without changing the data reading throughput per cycle.

Furthermore, there is no need to provide a plurality of word line to select one memory cell, which enables the configuration of the decoder to be simplified and the number of word lines to be reduced. Therefore, an increase in the area occupied by the memory cells can be suppressed and therefore an increase in the chip area can be prevented.

Figure 5:
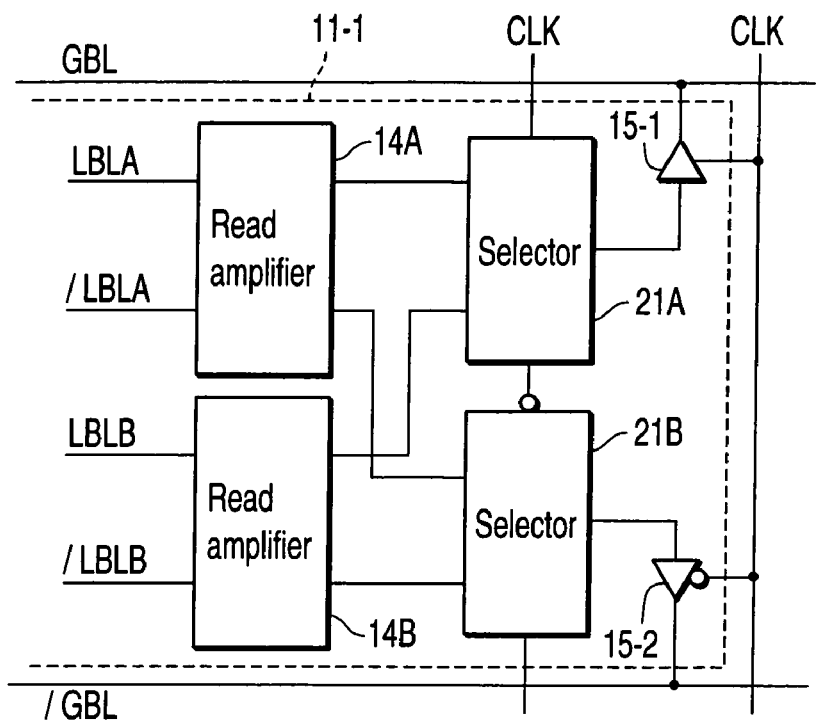
FIG. 5 is a circuit diagram of a modification of FIG. 1.

FIG. 5 shows a modification of the embodiment. In the embodiment, global bit lines GBL, /GBL have been provided for a pair of local bit lines LBL, /LBL. In contrast, the modification of FIG. 5 is such that global bit lines GBL, /GBL are provided for two pairs of local bit lines LBLA, /LBLA, LBLB, /LBLB. The local bit lines LBLA, /LBLA are connected to a read amplifier 14A. The local bit lines LBLB, /LBLB are connected to a read global bit line 14B. According to the clock signal, a selector 21A outputs one of the signal on the local bit line LBLA output from the read amplifier 14A and the signal on the local bit line LBLB output from the read amplifier 14B. According to the inverted clock signal CLK, a selector 21B outputs one of the signal on the local bit line /LBLA output from the read amplifier 14A and the signal on the local bit line /LBLB output from the read amplifier 14B. The try-state buffer 15-1 supplies the output signal of the selector 21A to global bit line GBL according to the clock signal CLK. The try-state buffer 15-2 supplies the output signal of the selector 21B to global bit line /GBL according to the inverted clock signal CLK.

The precharging of the local bit lines LBLA, /LBLA, LBLB, /LBLB, the activation of the word lines, the selection of the selectors 21A, 21B, the transfer operation of the try-state buffers 15-1, 15-2, and the selecting operation of the select circuit 18 are all performed at intervals of one cycle of the clock signal CLK. When the clock signal CLK is, for example, at the high level, the selector 21A selects local bit line LBLA. The selector 21B selects local bit line /LBLA when the clock signal CLK is, for example, at the high level. In addition, when the clock signal CLK is, for example, at the low level, the selector 21A selects local bit line LBLB. The selector 21B selects local bit line /LBLB when the clock signal CLK is, for example, at the low level.

Global bit lines GBL, /GBL are activated at intervals of, for example, two cycles of the clock signal CLK. The remaining configuration is the same as in FIG. 1.

Like the embodiment, even the modification enables the operating frequency to be increased. In this case, since the number of global bit lines can be reduced to half the number in FIG. 1, an increase in the occupied area can be prevented further.

Figure 6:
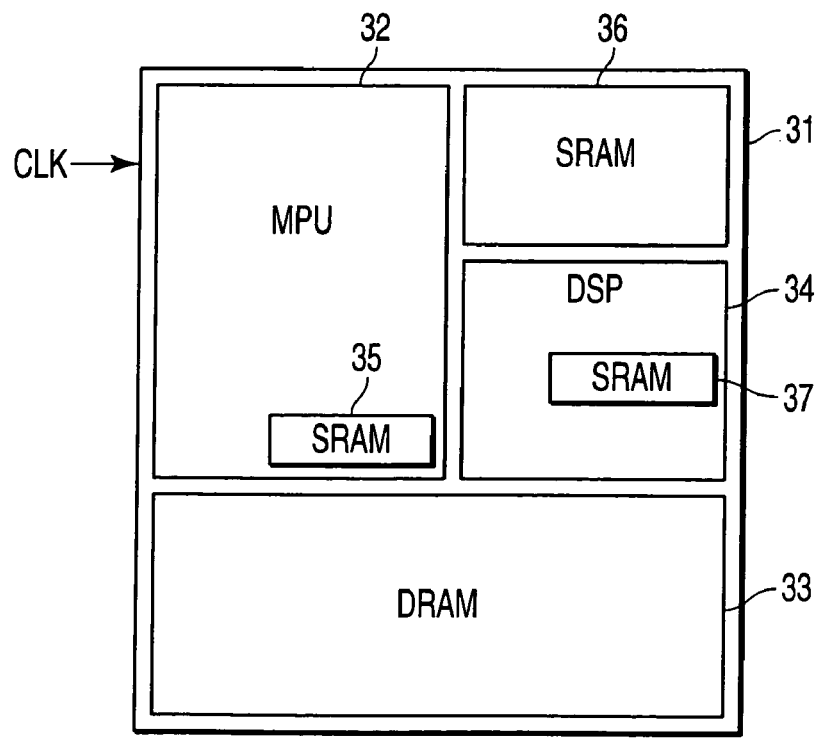
FIG. 6 is a plan view of an example of a system LSI to which an SRAM according to the embodiment and the modification is applied.

FIG. 6 shows an example of a system LSI to which the SRAM according to each of the embodiment and the modification is applied. The system LSI 31 includes, for example, a microprocessor unit (MPU) 32, a dynamic random access memory (DRAM) 33, and a digital signal processing circuit (DSP) 34. The MPU 32 has, for example, an SRAM 35 as a primary cache memory. In addition, next to the MPU 32, for example, an SRAM 36 is provided as a secondary cache memory. Moreover, the DSP 34 has, for example, an SRAM 37 constituting a register. The SRAM according to each of the embodiment and the modification can be applied to the SRAMs 35, 36, 37. The clock signal CLK of the system LSI 31 is used as the clock signal for the SRAMs 35, 36, 37.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
a plurality of sub-arrays each of which includes a plurality of memory elements;
first bit line pairs which are provided in each of said plurality of sub-arrays and which are connected to said plurality of memory elements; and
second bit line pairs which are provided so as to correspond to said plurality of sub-arrays and to which the first bit line pairs supply signals and which are operated at a lower frequency than the first bit line pairs.

2. The semiconductor memory device according to claim 1, wherein the first bit line pairs operate at the rising edge and falling edge of a clock signal, and
one of each of the second bit line pairs operates at the rising edge of the clock signal and the other of the pair operates at the falling edge of the clock signal.

3. The semiconductor memory device according to claim 2, further comprising:
a first transfer circuit which is connected between one of the first bit line pair and one of the second bit line pair; and
a second transfer circuit which is connected between the other of the first bit line pair and the other of the second bit line pair,
wherein the first and second transfer circuits operate alternately according to the clock signal and connect one of the first bit line pair to one of the second bit line pair and the other of the first bit line pair to the other of the second bit line pair.

4. The semiconductor memory device according to claim 3, further comprising a select circuit which is connected to the second bit line pair and which selects one of the second bit line pair according to the clock signal.

5. The semiconductor memory device according to claim 4, further comprising a plurality of second transistors which are connected to the second bit line pairs in a one-to-one correspondence and which are turned on at the rising edge or falling edge of the clock signal, thereby charging the second bit line pairs alternately.

6. The semiconductor memory device according to claim 5, wherein the clock signal is for operating a system LSI.

7. The semiconductor memory device according to claim 3, further comprising a plurality of first transistors which are connected to the first bit line pairs in a one-to-one correspondence and which are turned on at the rising edge and falling edge of the clock signal, thereby charging the first bit line pairs simultaneously.

8. The semiconductor memory device according to claim 1, wherein the memory elements are static RAMs.

9. A semiconductor memory device comprising:
a plurality of sub-arrays each of which includes a plurality of memory elements;
first bit line pairs which are arranged in a first column in each of said plurality of sub-arrays and which are connected to said plurality of memory elements;
second bit line pairs which are arranged in a second column in each of said plurality of sub-arrays and which are connected to said plurality of memory elements;
a first selector which selects either one of the first bit line pair or one of the second bit line pair;

a second selector which selects either the other of the first bit line pair or the other of the second bit line pair; and third bit line pairs which are provided so as to correspond to said plurality of sub-arrays and to which the first and second selectors selectively supply signals and which are operated at a lower frequency than the first and second bit line pairs.

10. The semiconductor memory device according to claim 9, wherein the first and second bit line pairs operate at the rising edge and falling edge of a clock signal.

11. The semiconductor memory device according to claim 10, further comprising:

a first transfer circuit which is connected between the first selector and one of the second bit line pair; and a second transfer circuit which is connected between the second selector and the other of the second bit line pair, wherein the first and second transfer circuits operate alternately according to the clock signal, thereby connecting the output terminal of the first selector to one of the second bit line pair and the second selector to the other of the second bit line pair.

12. The semiconductor memory device according to claim 10, further comprising a select circuit which is connected to the second bit line pair and which selects one of the second bit line pair according to the clock signal.

13. The semiconductor memory device according to claim 10, further comprising a plurality of first transistors which are connected to the first and second bit line pairs in a one-to-one correspondence and which are turned on at the rising edge and falling edge of the clock signal, thereby charging the first and second bit line pairs simultaneously.

14. The semiconductor memory device according to claim 10, further comprising a plurality of second transistors which are connected to the second bit line pairs in a one-to-one correspondence and which are turned on at the rising edge or falling edge of the clock signal, thereby charging the second bit line pairs alternately.

15. The semiconductor memory device according to claim 14, wherein the clock signal is for operating a system LSI.

16. The semiconductor memory device according to claim 9, wherein the memory elements are static RAMs.

17. A control method of semiconductor memory device comprising:

reading data of a selected memory cell by one of raising edge and falling edge of a clock signal and supplying the data to first bit line pairs;

supplying data supplied to the first bit line pairs to second bit line pairs by a frequency of a half of the clock signal; and selecting one of data of the second bit line pairs by the frequency of the clock signal.

18. The control method according to claim 17, wherein the second bit line pairs are precharged by a frequency half that of the first bit line pairs.

* * * * *